United States Patent [19]

Dennison

[11] Patent Number: 5,401,681
[45] Date of Patent: Mar. 28, 1995

[54] METHOD OF FORMING A BIT LINE OVER CAPACITOR ARRAY OF MEMORY CELLS

[75] Inventor: Charles H. Dennison, Boise, Id.

[73] Assignee: Micron Technology, Inc., Boise, Id.

[21] Appl. No.: 277,916

[22] Filed: Jul. 20, 1994

Related U.S. Application Data

[63] Continuation-in-part of Ser. No. 47,668, Apr. 14, 1993, Pat. No. 5,338,700, and a continuation-in-part of Ser. No. 17,067, Feb. 12, 1993, Pat. No. 5,340,763.

[51] Int. Cl.$^6$ ............................................. H01L 21/72
[52] U.S. Cl. ..................................... 437/60; 437/919; 437/977
[58] Field of Search .................... 437/47, 48, 49, 52, 437/60, 915, 919, 977; 148/DIG. 14, DIG. 164, DIG. 138

[56] References Cited

U.S. PATENT DOCUMENTS

| | | | |
|---|---|---|---|
| 5,134,086 | 7/1992 | Ahn | 437/977 |
| 5,227,322 | 7/1993 | Ko et al. | 437/60 |
| 5,266,514 | 11/1993 | Tuan et al. | 437/60 |

OTHER PUBLICATIONS

Ahn, J. H., et al.: "Micro Villus Patterning (MVP) Technology for 256 Mb DRAM Stack Cell", 1992 Symp. on VLSI Tech. Dig. of Tech. Papers, pp. 12–13.

Primary Examiner—Brian E. Hearn
Assistant Examiner—Chandra Chaudhari
Attorney, Agent, or Firm—Wells, St. John, Roberts, Gregory & Matkin

[57] ABSTRACT

A method of forming a bit line over capacitor array of memory cells includes, a) providing an array of word lines; b) providing active areas about the word lines to define an array of memory cell FETs; c) providing a layer of electrically insulating material over the word lines and active areas; d) providing first and second respective contact openings through the insulating material layer to capacitor and bit contact active regions; e) providing electrically conductive material within the first and second contact openings which electrically connects with the respective capacitor and bit active regions, with the electrically conductive material within the respective first and second contact openings collectively extending elevationally over and above the insulating material upper surface, the electrically conductive material within the first contact openings electrically connecting with the electrically conductive material of the second contact openings above the insulating material upper surface; and f) in a single step, chemical-mechanical polishing the collective electrically conductive material extending over and above the insulating material upper surface downwardly to at least the upper surface of the insulating material, the single chemical-mechanical polishing step effectively electrically isolating the conductive material within the first contact openings from the conductive material within the second contact openings.

15 Claims, 16 Drawing Sheets

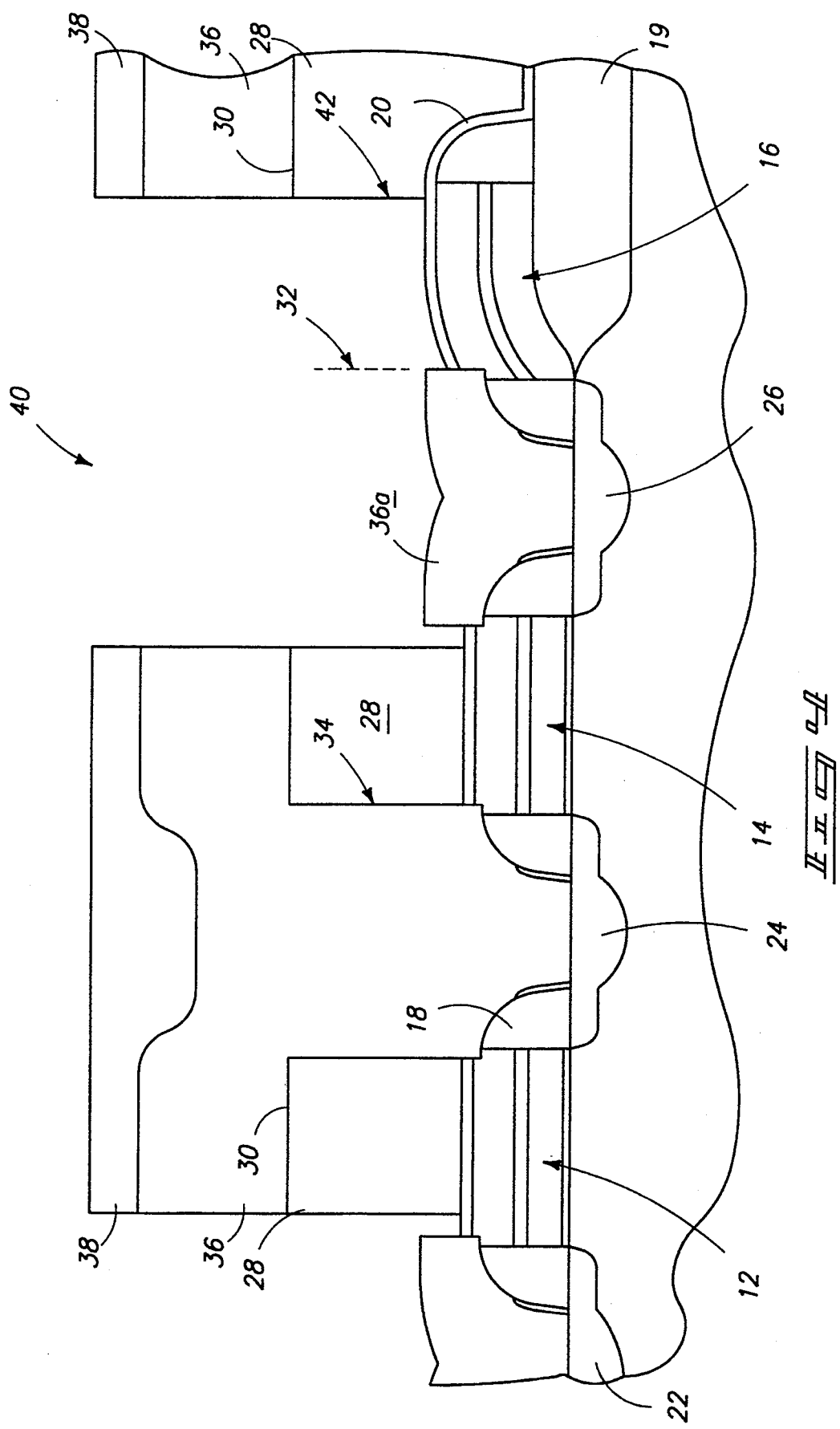

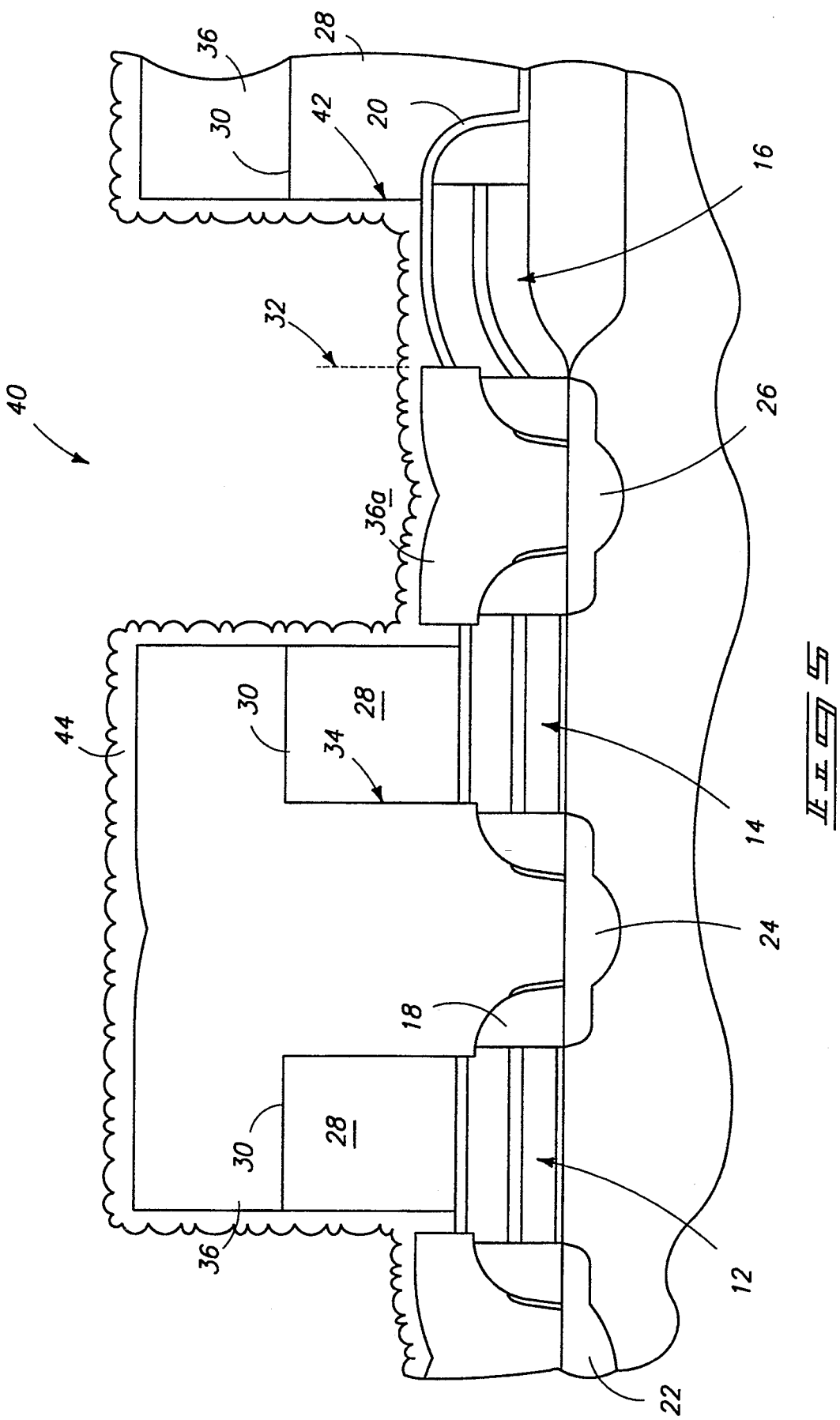

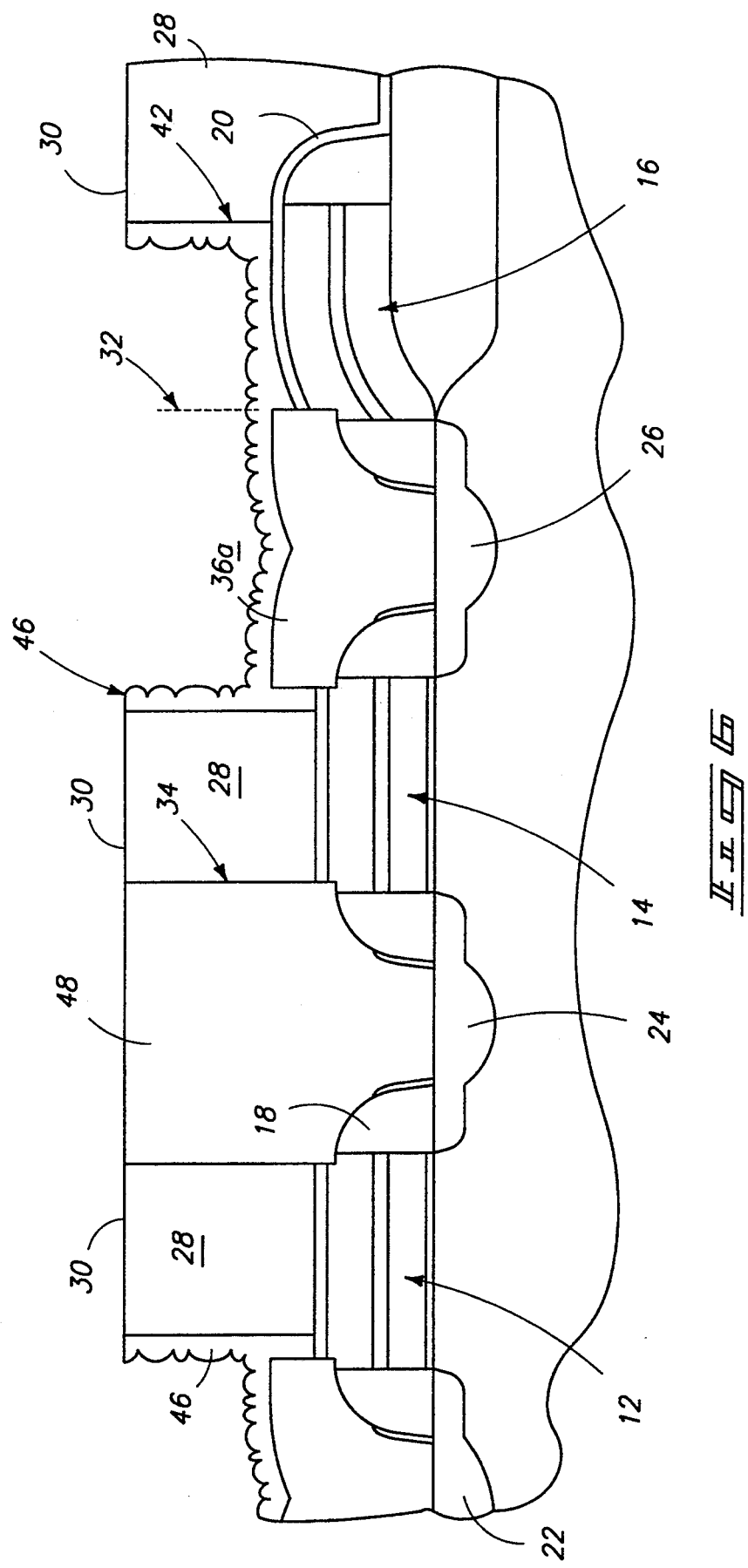

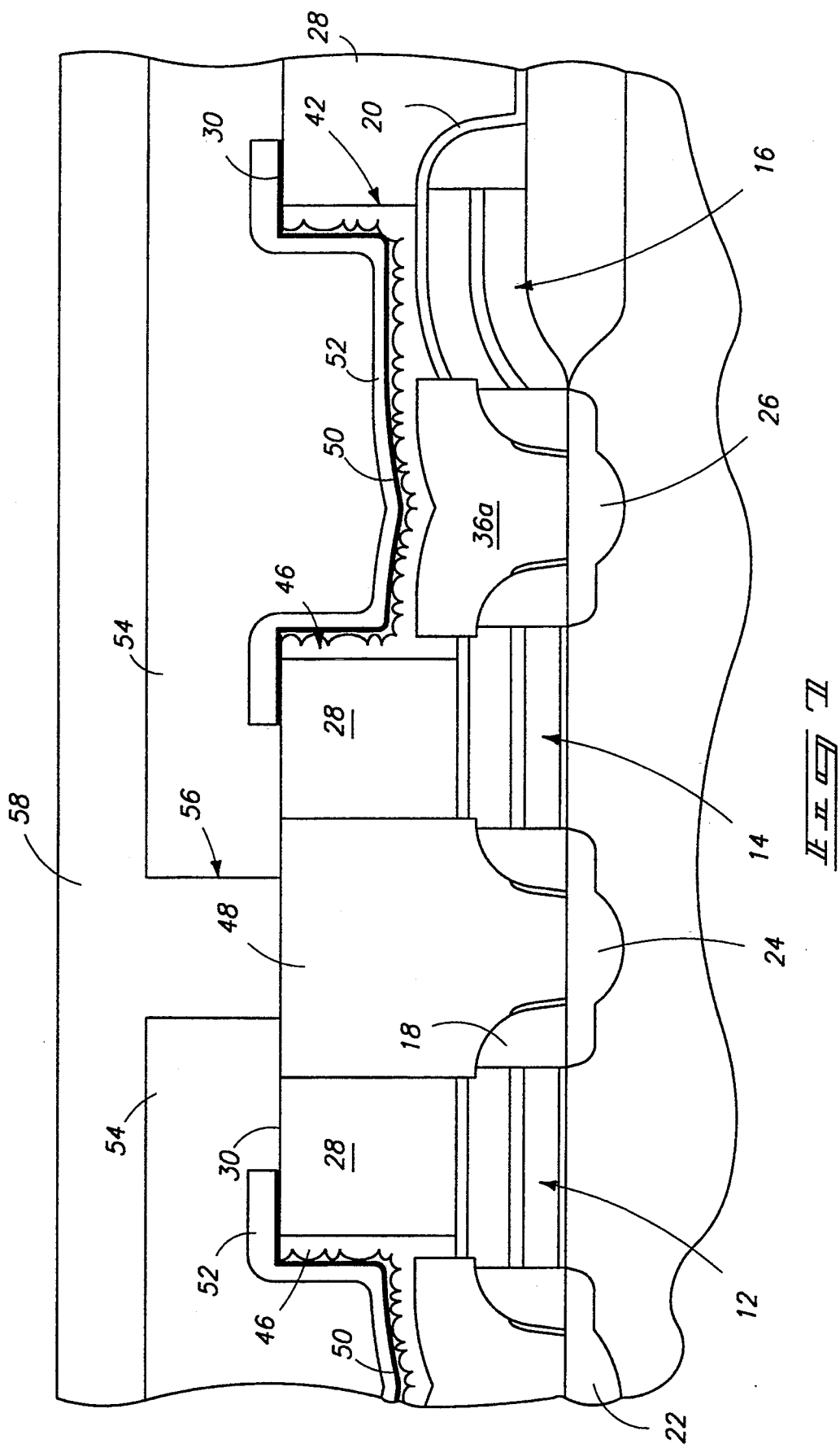

5,401,681

METHOD OF FORMING A BIT LINE OVER CAPACITOR ARRAY OF MEMORY CELLS

RELATED PATENT DATA

This patent resulted from a continuation-in-part patent application of U.S. patent application Ser. No. 08/047,668, filed on Apr. 14, 1993, entitled "Method Of Forming A Bit Line Over Capacitor Array Of Memory Cells", listing Charles H. Dennison and Aftab Ahmad as inventors, and which is now U.S. Pat. No. 5,338,700, and of U.S. patent application Ser. No. 08/017,067, filed on Feb. 12, 1993, entitled "Multi Pin Stacked Capacitor And Process To Fabricate Same", listing Charles H. Dennison as the inventor, and which is now U.S. Pat. No. 5,340,763.

TECHNICAL FIELD

This invention relates generally to formation of a bit line over capacitor arrays of memory cells.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area, The principal way of increasing cell capacitance is through cell structure techniques. Such techniques include three-dimensional cell capacitors, such as trenched or stacked capacitors.

Conventional stacked capacitor DRAM arrays utilize either a buried bit line or a non-buried bit line construction. With buried bit line constructions, bit lines are provided in close vertical proximity to the bit line contacts of the memory cell field effect transistors (FETs), with the cell capacitors being formed horizontally over the top of the word lines and bit lines. With non-buried bit line constructions, deep vertical contacts are made through a thick insulating layer to the cell FETs, with the capacitor constructions being provided over the word lines and beneath the bit lines. Such non-buried bit line constructions are also referred to as "capacitor-under-bit line" or "bit line-over-capacitor" constructions, and are the subject of this invention.

BRIEF DESCRIPTION OF THE DRAWINGS

Preferred embodiments of the invention are described below with reference to the following accompanying drawings.

FIG. 4 is a diagrammatic section of the FIG. 1 wafer illustrated at a processing step subsequent to that shown by FIG. 3.

FIG. 5 is a diagrammatic section of the FIG. 1 wafer illustrated at a processing step subsequent to that shown by FIG. 4.

FIG. 6 is a diagrammatic section of the FIG. 1 wafer illustrated at a processing step subsequent to that shown by FIG. 5.

FIG. 7 is a diagrammatic section of the FIG. 1 wafer illustrated at a processing step subsequent to that shown by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with an aspect of the invention, a method of forming a bit line over capacitor array of memory cells includes the following steps:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a layer of electrically insulating material over the word lines and active areas, the layer of insulating material having an upper surface which is above the word lines;

providing first and second respective contact openings through the insulating material layer to the respective first and second active regions;

providing electrically conductive material within the first and second contact openings which electrically connects with the respective first and second active regions, the electrically conductive material within the respective first and second contact openings collectively extending elevationally over and above the insulating material upper surface, the electrically conductive material within the first contact openings electrically connecting with the electrically conductive material of the second contact openings above the insulating material upper surface; and in a single step, chemical-mechanical polishing the collective electrically conductive material extending over and above the insulating material upper surface downwardly to at least the upper surface of the insulating material, the single chemical-mechanical polishing step effectively electrically isolating the conductive material within the first contact openings from the conductive material within the second contact openings.

The word "contact" as used in this document includes container-wide openings, such as for forming capacitor constructions.

Figure 1:
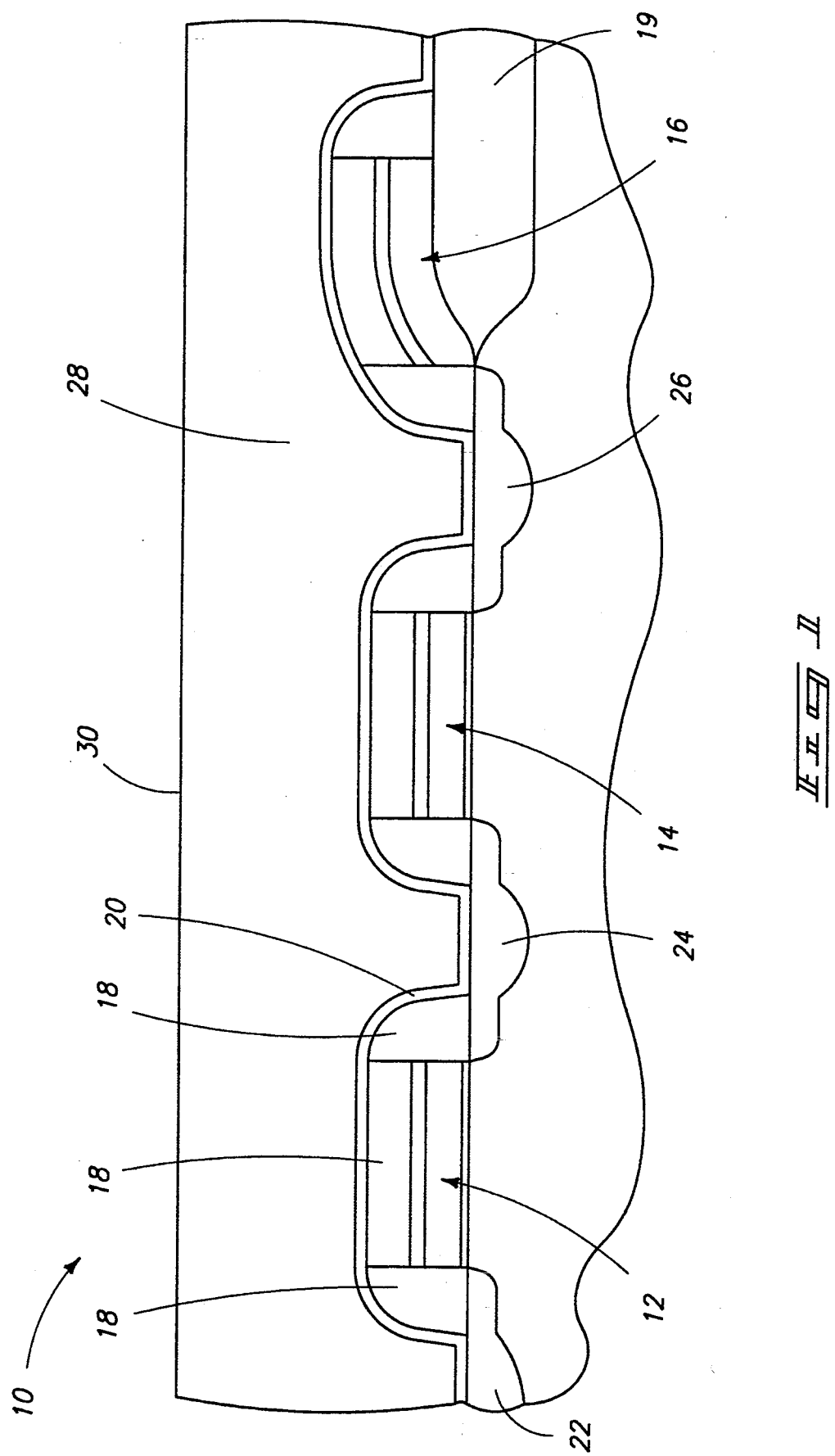
FIG. 1 is a diagrammatic section of a semiconductor wafer shown at one processing step in accordance with the invention.

Referring first to FIG. 1, a semiconductor wafer is indicated generally by reference numeral 10. Wafer 10 has been provided with an array of substantially electrically isolated word lines, such as the illustrated word lines 12, 14 and 16. Such word lines are of a conventional construction having a lowermost gate oxide, a lower polysilicon layer, an overlying silicide layer such as tungsten silicide, and insulating caps and side insulating spacers 18. Such spacers and caps 18 preferably comprise an insulative nitride, such as $Si_3N_4$. A thin layer 20 of $Si_3N_4$ is provided atop the wafer to function as a diffusion barrier. Layer 20 has a thickness which is preferably from about 100 Angstroms to about 250 Angstroms.

Active areas are provided about the word lines, such as active regions 22, 24 and 26, to define an array of memory cell FETs. The discussion proceeds with reference to a FET formed using word line 14, which will be provided with a capacitor construction for definition of a single memory cell. Active region 26 defines a first active region for electrical connection with a memory cell capacitor (described below). Active region 24 defines a second active region for electrical connection with a bit line (described below). Field oxide 19 is provided, as shown.

A planarized first layer 28 of an insulating material is provided over the word lines and active areas. An example material is borophosphosilicate glass (BPSG). An example deposition thickness is between 6000 and 9000 Angstroms, with subsequent planarization by chemical mechanical polishing (CMP) to an elevation of from about 2000 Angstroms to about 4000 Angstroms above the word line nitride caps 18 which are, positioned adjacent the active areas, as opposed to the word lines which are over the field oxide. Such provides a planarized upper surface 30 which is elevationally above the word lines.

Figure 2:
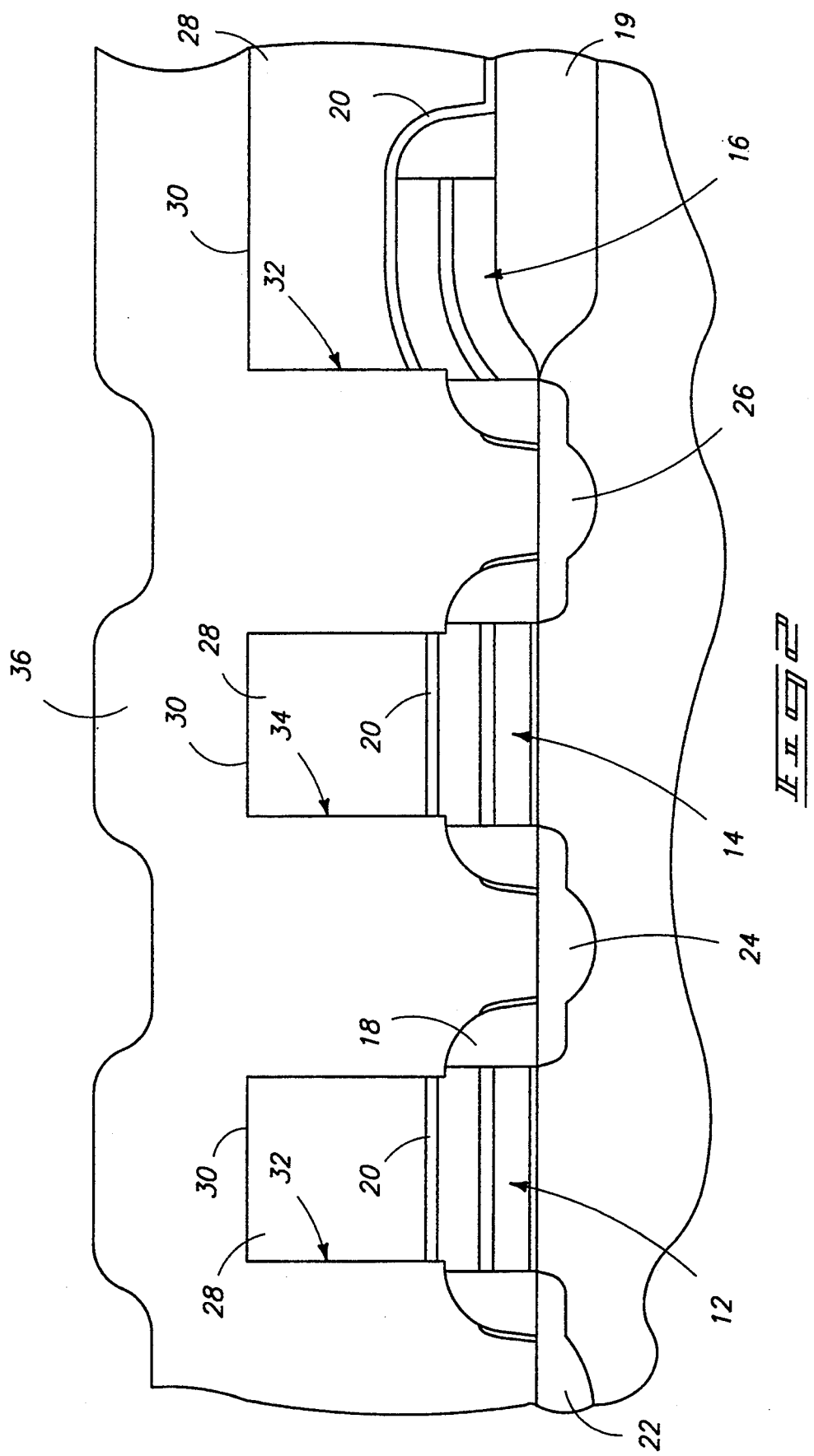
FIG. 2 is a diagrammatic section of the FIG. 1 wafer illustrated at a processing step subsequent to that shown by FIG. 1.

Referring to FIG. 2, a series of first contact openings 32 and second contact openings 34 are provided through first layer 28 to first and second active regions 26 and 24, respectively. Such would typically be formed by photomasking and dry chemical etching of BPSG selectively relative to nitride. An example etch chemistry would include $CHF_3$ and $O_2$ at low $O_2$ flow rate (i.e., less than 5% $O_2$ by volume in a $CHF_3/O_2$ mixture), or the combination of $CF_4$, Ar, $CH_2F_2$ and $CHF_3$. Thereafter, a blanket etch of the wafer is conducted to etch nitride layer 20 selectively to silicon to upwardly expose active regions 26 and 24. An example etch chemistry would include a combination of $CHF_3$ and $CF_4$. The principle purpose of barrier layer 20 is to prevent diffusion of boron or phosphorous atoms from BPSG layer 28 into active areas 24 and 26. Caps 18 are preferably comprised of nitride ($Si_3N_4$) where layer 28 is comprised of oxide, such that the contact etch to produce first contacts 32 will stop relative to word lines spacers and caps 18.

A layer 36 of electrically conductive material is deposited to provide electrically conductive material within first and second contact openings 32 and 34, respectively, which electrically connects with respective first and second active regions 26 and 24. Layer 36 constitutes a first layer of conductive material which overfills first and second contact openings 32 and 34. An example and preferred material is in situ arsenic doped polysilicon. Electrically conductive material of layer 36 from within respective first and second compact openings 32 and 34 collectively extends elevationally over and above insulating material upper surface 30. The material of layer 36 at this point in the preferred process is everywhere homogenous, such that electrically conductive material within first contact openings 32 and electrically conductive material from within second contact openings 34 extend outwardly thereof and electrically connects with one another.

Figure 3:
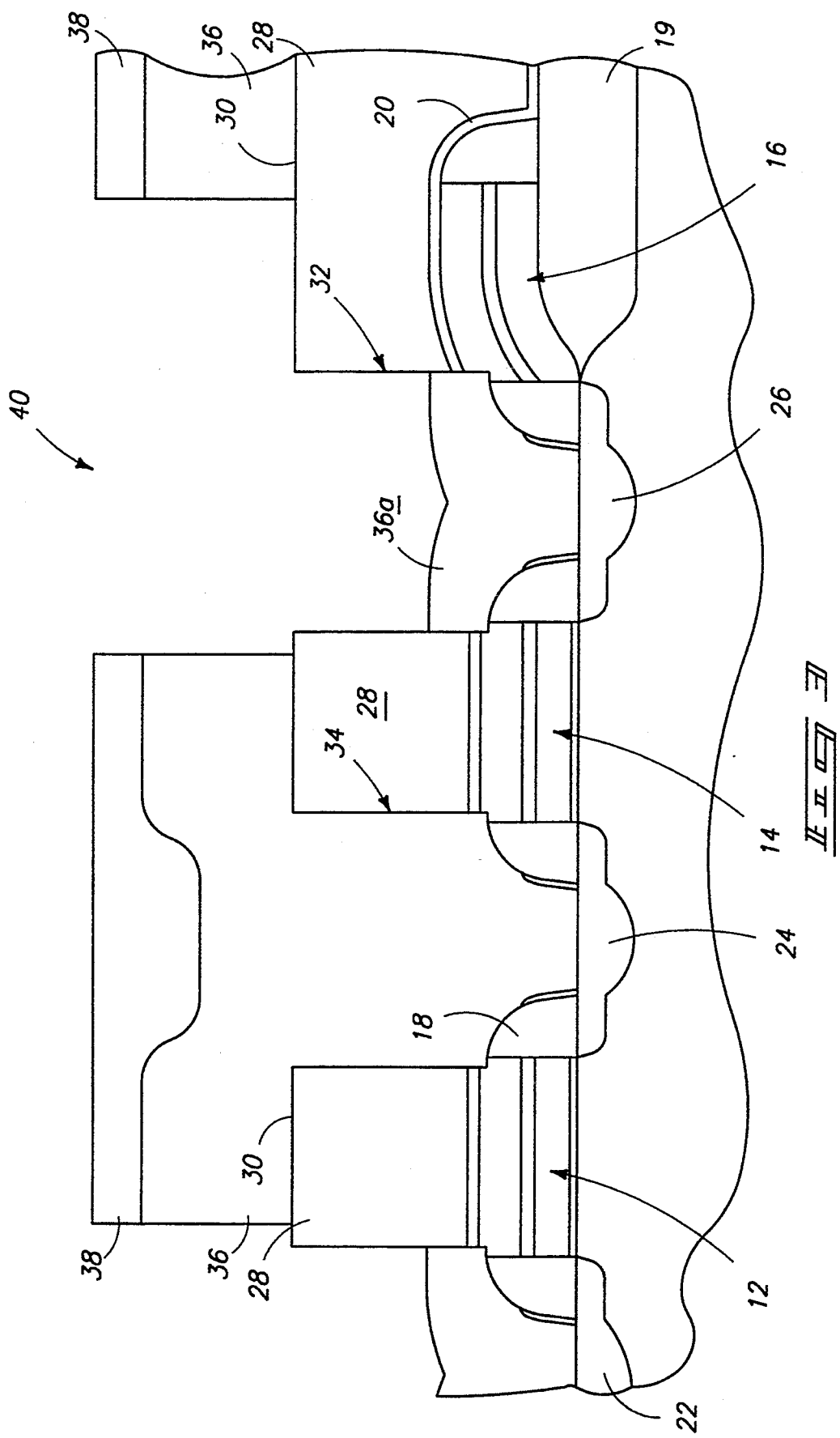
FIG. 3 is a diagrammatic section of the FIG. 1 wafer illustrated at a processing step subsequent to that shown by FIG. 2.

Referring to FIG. 3, a layer 38 of photoresist is deposited and photopatterned to define a mask opening 40 over first active region 26. First conductive material layer 36 is etched through mask opening 40 selectively relative to insulating material layer 28. An example etch where material 28 is BPSG and material 36 is polysilicon would include a dry plasma using $SF_6$ and $Cl_2$. Such will reduce conductive layer 36 material within mask opening 40 downwardly, thereby defining a capacitor storage node plug 36a.

Referring to FIG. 4, a subsequent etch of material 28 selective to conductive layer material 36 is conducted through mask opening 40 to define a third contact opening 42 in layer 28 which overlaps with first contact opening 32. (The previous position of contact opening 32 is shown by dotted line in FIGS. 4–6).

Referring to FIG. 5, an electrically conductive capacitor storage node layer 44 is provided over the first conductive material layer 36 to within third contact opening 42 and in contact with plug 36a. Thus, storage node layer 44 electrically connects with first active regions 26 through conductive plug 36a. Also, layers 44 and 36 overlap one another over insulating material upper surface 30. An example and preferred material for layer 44 is hemispherical grain (HSG) polysilicon. Such can be provided by first depositing a 600 Angstrom thick in situ doped polysilicon layer, followed by deposition of undoped HSG poly. Subsequent wafer heating inherent in wafer processing will effectively conductively dope the overlying HSG poly layer. Alternately, layer 44 can be provided by in situ arsenic doping of an entire HSG layer.

At this point in the process, the overall composition of electrically conductive material within first contact opening 32 is different than the overall composition of electrically conductive material within second contacts 34. While in the preferred embodiment the conductive material is everywhere some form of polysilicon, the composition of conductive material within second contact 34 is homogenous therewithin, while composition of material within the first contact opening 32 is nonhomogenous in the combination of non-HSG polysilicon plug 36a and HSG polysilicon layer 44. Also, capacitor storage node layer 44 less than completely fills first contact opening 32.

Referring to FIG. 6, the collective electrically conductive material of layers 44 and 36 extending over and above insulating material upper surface 30 is chemical-mechanical polished in a single step downwardly to at least upper surface 30. Such single chemical-mechanical polishing step effectively electrically isolates the conductive material from within what was first contact openings 32 from conductive material within contact openings 34. This defines an isolated capacitor storage node 46 within the first and third contact openings 32 an 42, and defines a conductive plug 48 (of layer 36 material) extending upwardly from second active region 24. An example and preferred chemical-mechanical polishing step to achieve the FIG. 6 construction includes using slurry SC25 from Rodel Products Corporation of Newark, Del., diluted with H₂O and KOH. SC25 consists primarily of H₂O, silica (SiO₂ particles), and KOH. It is diluted approximately 1:1 with H₂O and additional KOH is injected at the point of use to increase the pH and adjust the oxide to silicon etch rate. As more KOH is injected, the oxide removal rate decreases relative to the polysilicon removal rate (preferred).

Processing would then continue to finish production of the capacitor construction and digit lines. Such is described by example with reference to FIG. 7. An oxide-nitride-oxide (ONO) cell dielectric layer 50 is provided, followed by a layer 52 of cell polysilicon which is patterned as desired. Subsequently, a BPSG layer 54 is deposited and patterned to provide a contact opening 56 downwardly to bit contact plug 48. A digit line material 58 is deposited and patterned to provide desired digit lines.

Figure 8B:
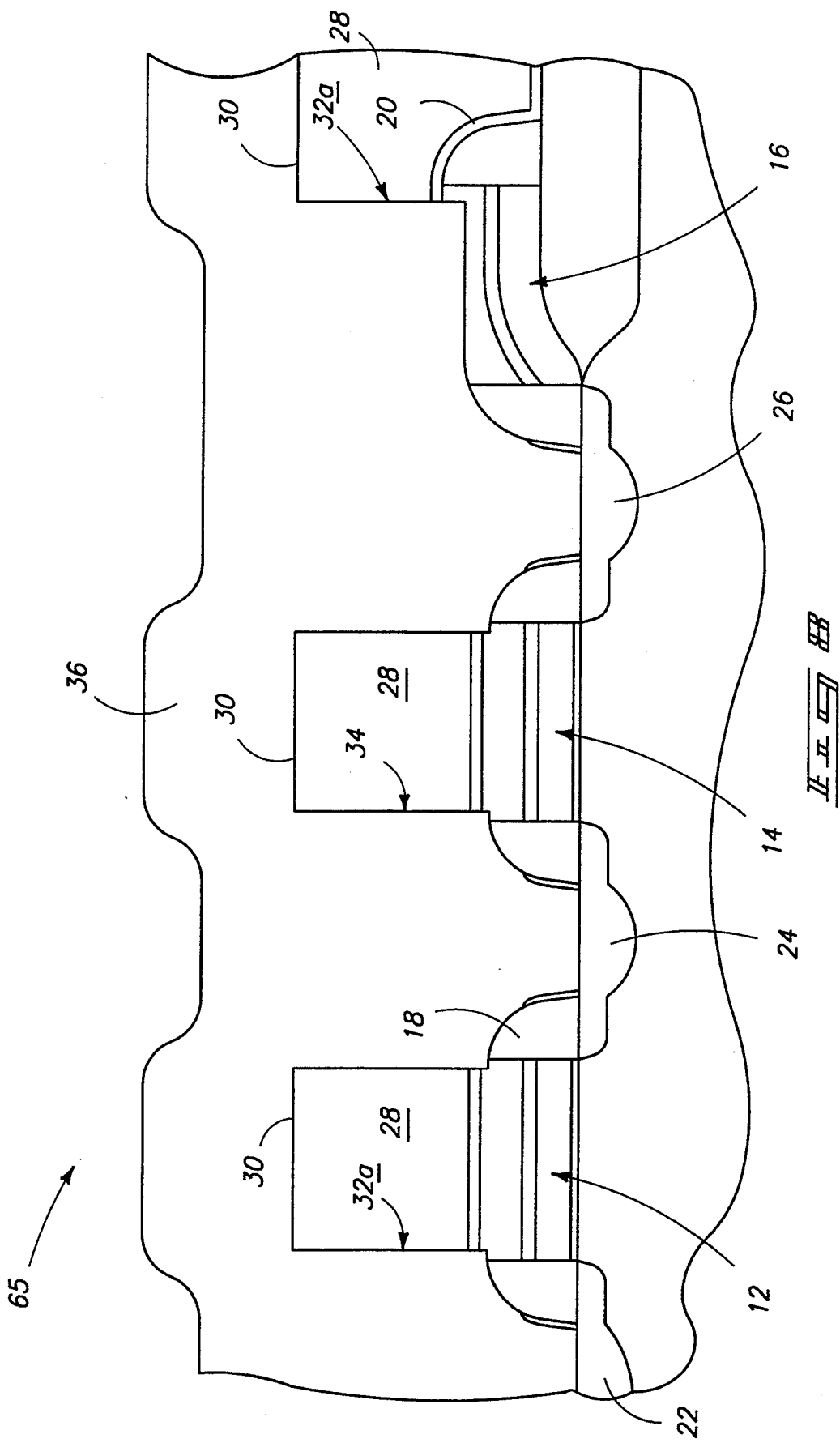
FIG. 8 is a diagrammatic section of an alternate embodiment semiconductor wafer shown at an alternate processing step in accordance with the invention.

An alternate embodiment in accordance with the invention is described with reference to FIGS. 8–16. Referring first to FIG. 8, a semiconductor wafer fragment 65 is shown in process. Such is essentially the same as that shown by FIG. 2, but for the enlarged first contact 32a which is shown to be as large as contact 42 of FIG. 4. Like numbers where otherwise appropriate from the first embodiment are utilized in the FIGS. 8–16 construction.

Figure 9:
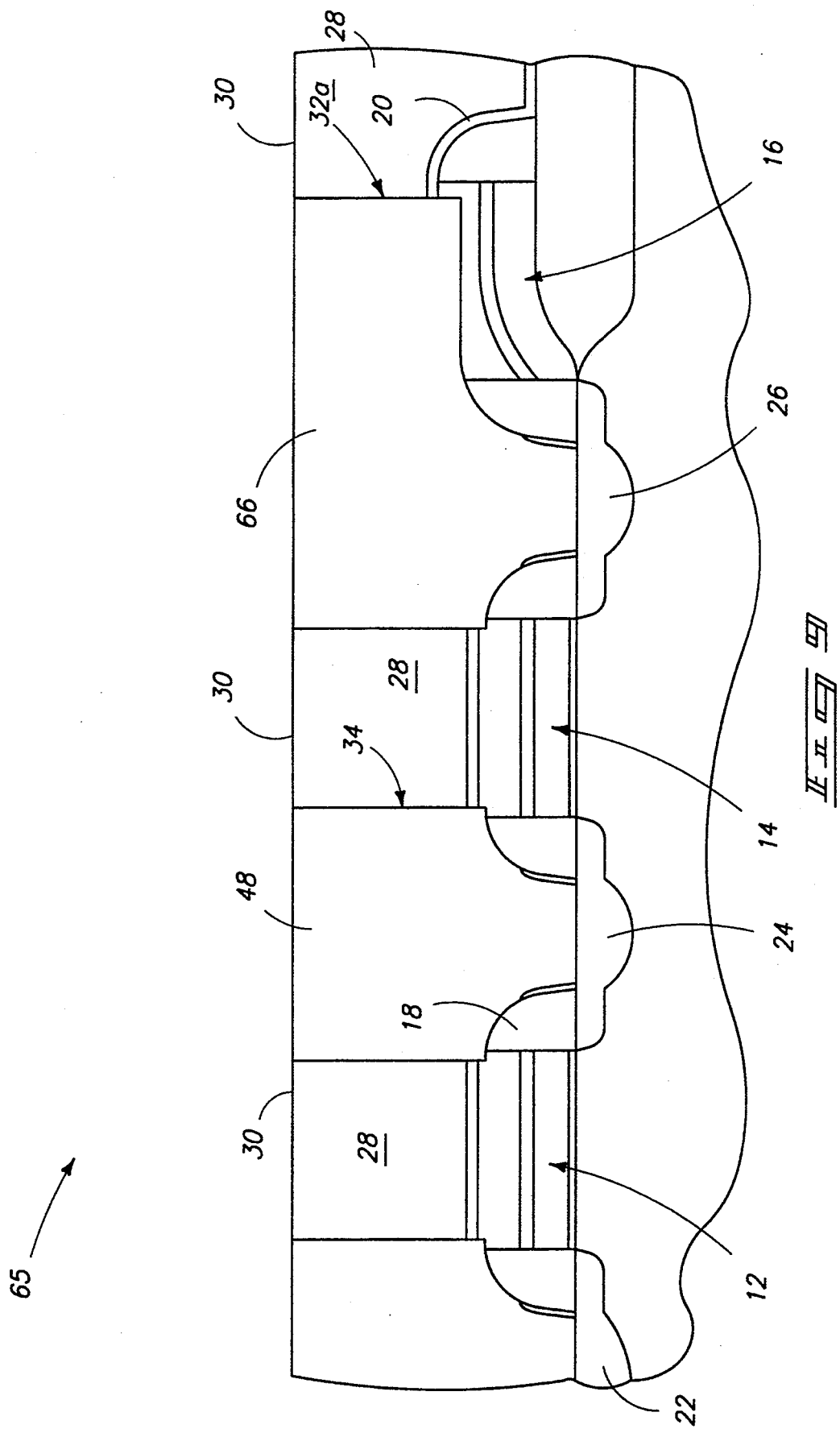
FIG. 9 is a diagrammatic section of the FIG. 8 wafer illustrated at a processing step subsequent to that shown by FIG. 8.

Referring to FIG. 9, layer 36 is chemical-mechanical polished in a single step to provide the illustrated construction which includes, in different part from the first embodiment, a plug 66 of polysilicon material filling the essential entirety of the first contact opening 32a. Thus in this described embodiment, all of the electrically conductive material within first contact opening 32a is of the same composition as all of the electrically conductive material within second contact opening 34 during the single chemical-mechanical polishing step, with such material also being everywhere homogenous within the first and second contact openings.

Figure 10:
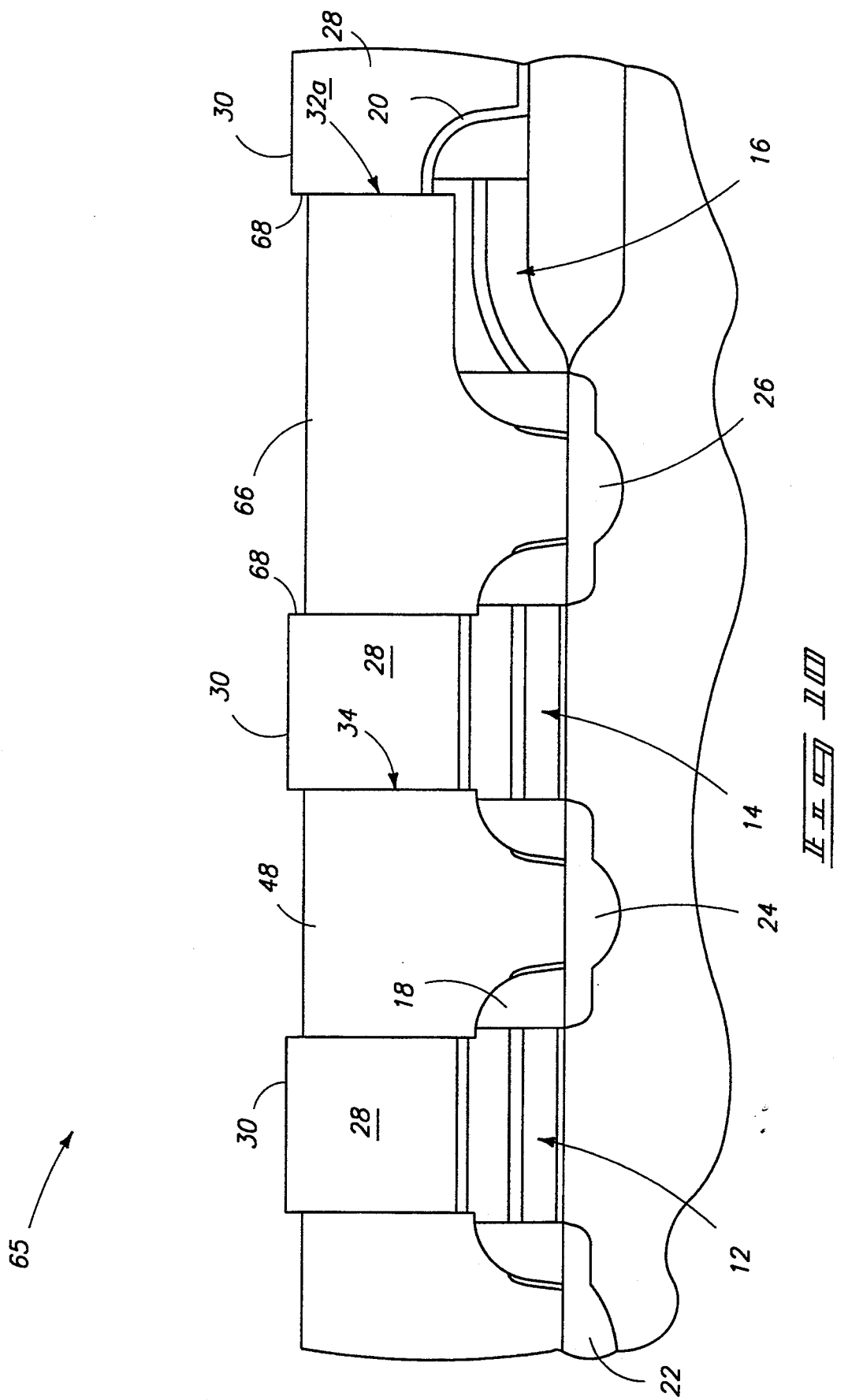
FIG. 10 is a diagrammatic section of the FIG. 8 wafer illustrated at a processing step subsequent to that shown by FIG. 9.

Referring to FIG. 10, plugs 48 and 66 are recessed 1000 Angstroms below upper surface 30 of insulating material 28. Such recesses could be produced in situ in the CMP by increasing the poly etchant component of the slurry, or in a separate dry or wet etching step. An example wet etch would included H₂O₂, NH₄F and H₂O. An example dry etch would use SF₆ and Cl₂, and plasma. For purposes of the continuing discussion, such etching defines edges 68 of insulating material 28 within first contact opening 32a.

Figure 11:
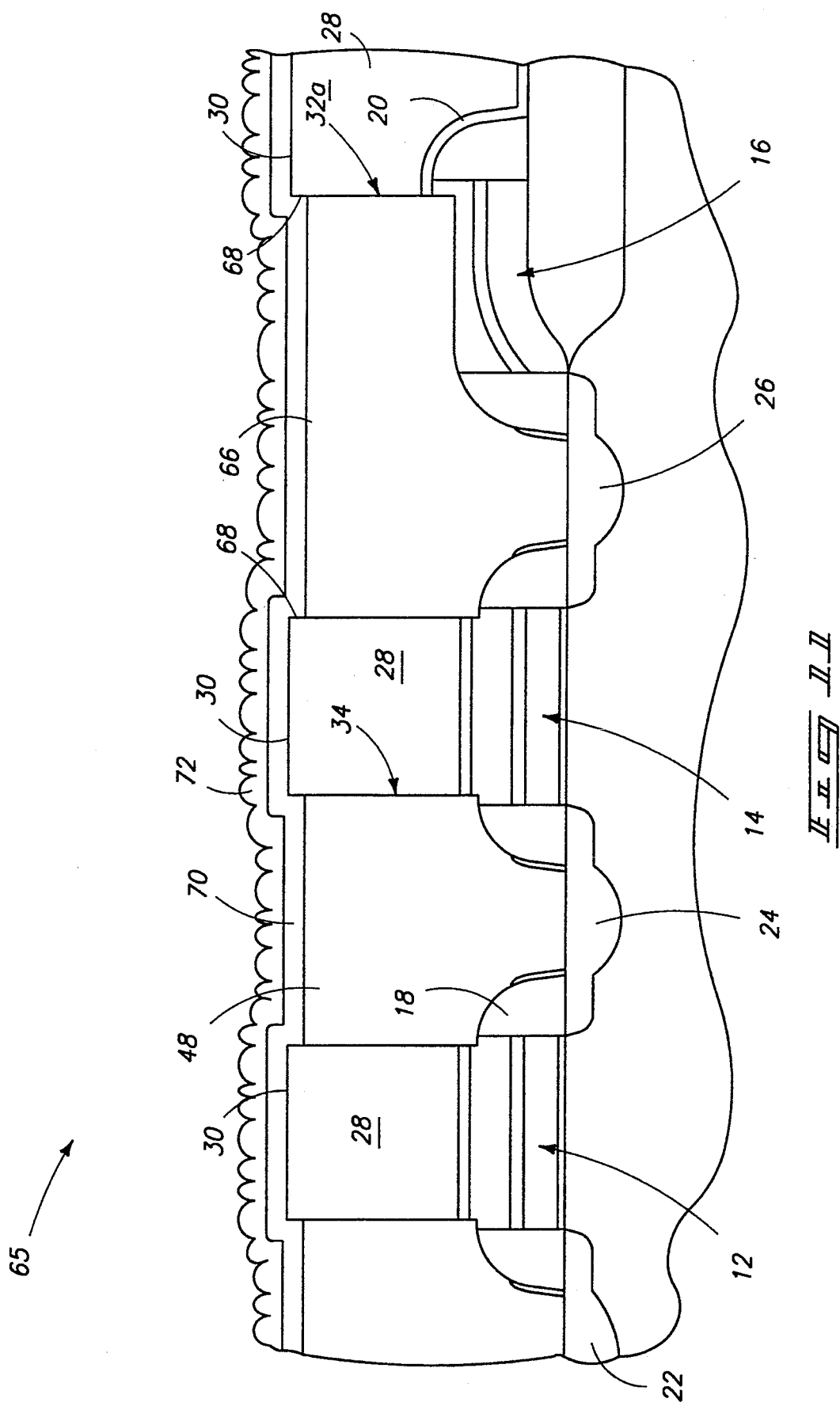
FIG. 11 is a diagrammatic section of the FIG. 8 wafer illustrated at a processing step subsequent to that shown by FIG. 10.

Referring to FIG. 11, a layer 70 of masking material is deposited over the recessed electrically conductive plug 66 within first contact opening 32a. A preferred material is SiO₂ deposited to a thickness of from about 500 Angstroms to about 1,500 Angstroms. Thereafter, a layer 72 of HSG polysilicon is deposited over masking layer 70. An example preferred thickness is 500 Angstroms.

Figure 12:
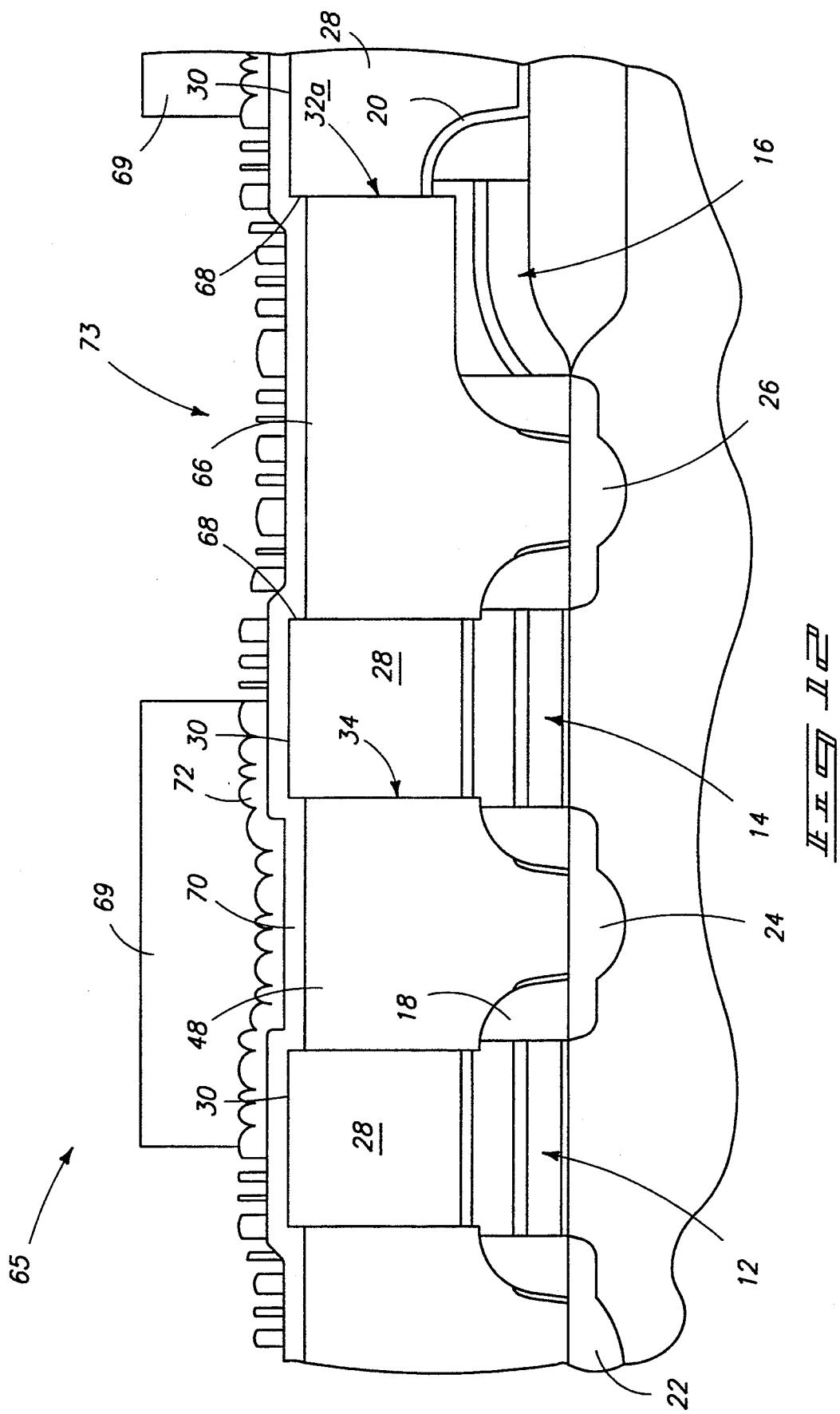
FIG. 12 is a diagrammatic section of the FIG. 8 wafer illustrated at a processing step subsequent to that shown by FIG. 11.

Referring to FIG. 12, a layer of photoresist 69 is deposited and patterned to cover the non-first contact opening area of the wafer. Then, partial blanket etching is conducted through HSG layer 72 over electrically conductive material plug 66 within first contact opening 32a selectively relative to oxide masking material 70 to define a hemispherical grain polysilicon archipelago mask 73. Such effectively completely etches through the irregular thinnest locations of the HSG layer, and does not completely etch through the thickest portions, thus effectively leaving the illustrated mask. Such can be produced by conducting a timed etch using a SF₆ and Cl₂ plasma.

Figure 13:
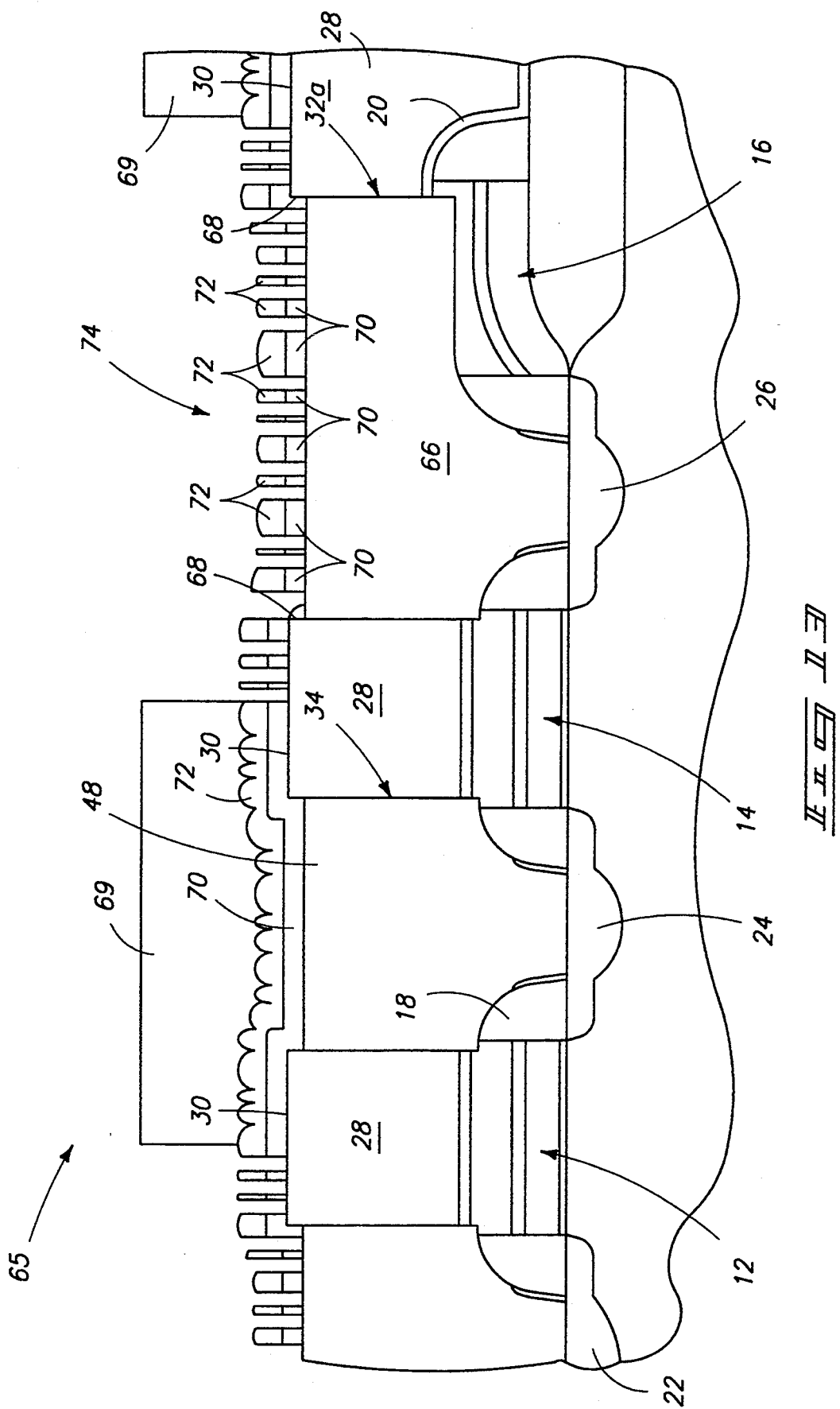
FIG. 13 is a diagrammatic section of the FIG. 8 wafer illustrated at a processing step subsequent to that shown by FIG. 12.

Referring to FIG. 13, oxide masking material not covered by the etched HSG polysilicon is selectively etched relative to polysilicon archipelago mask 73 to form an archipelago mask 74 of the oxide masking material. An example etch would be a CF₄ and H₂ plasma. Such mask comprises masking material positioned against recess edges 68 due to the vertical drop of polysilicon in such area which prevents complete removal of the same. Such is desirable in the preferred embodiment, which is the reason why plug 66 is preferably recessed.

Figure 14:
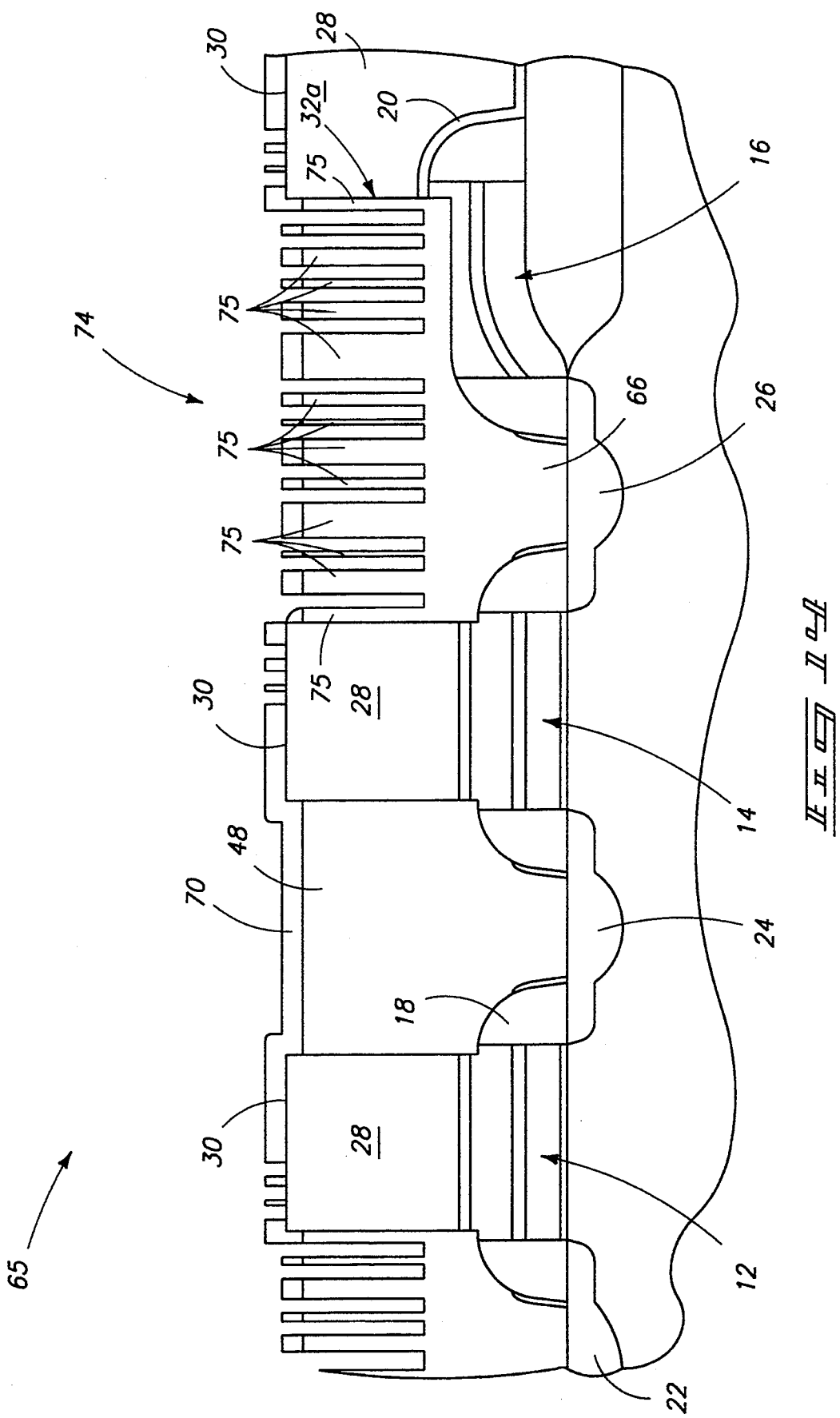
FIG. 14 is a diagrammatic section of the FIG. 8 wafer illustrated at a processing step subsequent to that shown by FIG. 13.
Figure 15:
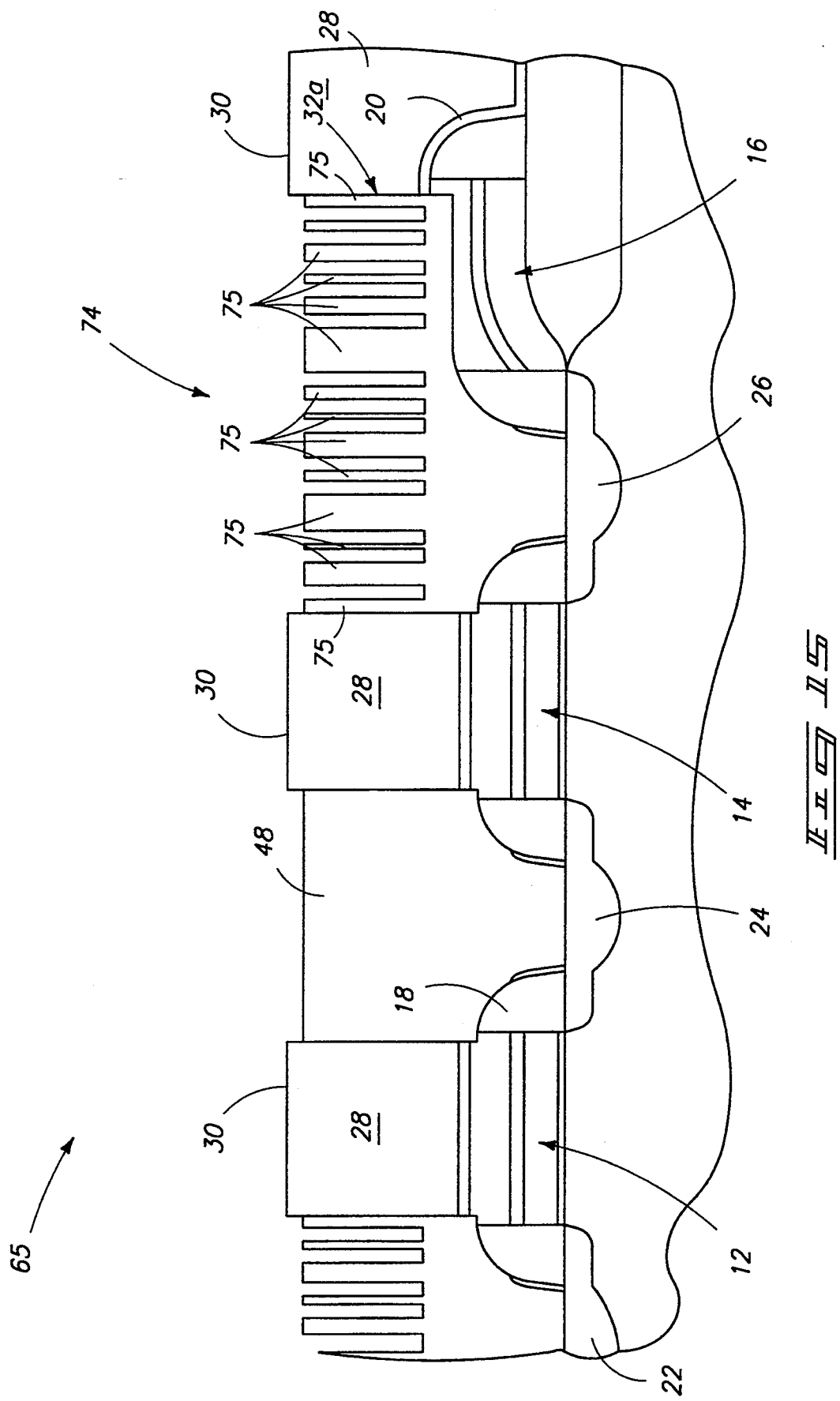
FIG. 15 is a diagrammatic section of the FIG. 8 wafer illustrated at a processing step subsequent to that shown by FIG. 14.

Referring to FIG. 14, mask 69 is removed and the electrically conductive material of plug 66 is etched into selectively relative to the oxide masking material of archipelago mask 74 to form a series of substantially vertical villus bars 75 of electrically conductive material within first contact opening 32a. Such also etches remaining material of layer 72 (not shown in FIG. 14). Thereafter, the archipelago masking material over villus bars 75 is removed selectively relative to polysilicon, as is all other exposed material of layer 70. The result is shown in FIG. 15.

Figure 16:
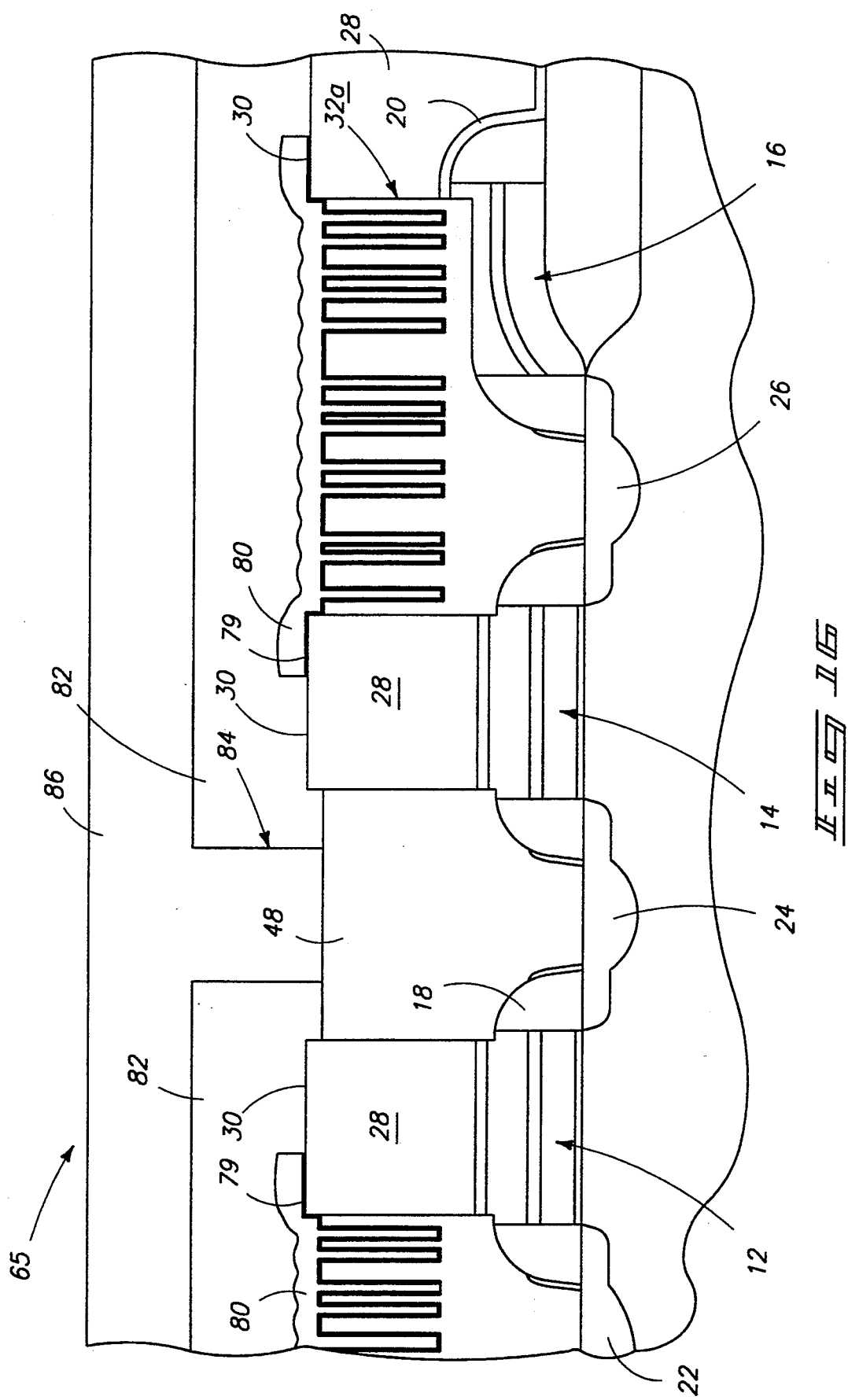
FIG. 16 is a diagrammatic section of the FIG. 8 wafer illustrated at a processing step subsequent to that shown by FIG. 15.

Referring to FIG. 16, a suitable capacitor cell dielectric ONO layer 79 is deposited, followed by subsequent deposition of a capacitor cell layer 80 which is patterned as shown. Then, a layer 82 of insulating material (i.e., BPSG) would be deposited and patterned to provide a contact opening 84 extending inwardly to the upper surface of bit line plug 48. Subsequently, an electrically conductive bit line layer 86 is deposited and patterned. This described construction has the advantage of maximizing cell capacitance by maximizing area between the storage node and cell layers within contact 32a.

Alternate constructions are of course contemplated with the invention only being limited by the accompanying claims appropriately interpreted in accordance with the doctrine of equivalents. By way of example, photoresist layer 69 covering bit block 48 in FIG. 12 could be eliminated. Such would result in villus bar formation within block 48.

The above described embodiment in utilizing a single CMP step to electrically isolate conductive material within the bit contacts from the container contacts has significant advantages over the prior art. For example, multiple other CMP, photopatterning, etching, and oxide deposition steps can be eliminated.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a bit line over capacitor array of memory cells comprising the following steps:

provyding rant array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a layer of electrically insulating material over the word lines and active areas, the layer of insulating material having an upper surface which is above the word lines;

providing first and second respective contact openings through the insulating material layer to the respective first and second active regions;

providing electrically conductive material within the first and second contact openings which electrically connects with the respective first and second active regions, the electrically conductive material within the respective first and second contact openings collectively extending elevationally over and above the insulating material upper surface, the electrically conductive material within the first contact openings electrically connecting with the electrically conductive material of the second contact openings above the insulating material upper surface; and in a single step, chemical-mechanical polishing the collective electrically conductive material extending over and above the insulating material upper surface downwardly to at least the upper surface of the insulating material, the single chemical-mechanical polishing step effectively electrically isolating the conductive material within the first contact openings from the conductive material within the second contact openings.

2. The method of forming a bit line over capacitor array of memory cells of claim 1 wherein all of the electrically conductive material within the first contact openings is of the same composition as all of the electrically conductive material within the second contact openings during the single chemical-mechanical polishing step.

3. The method of forming a bit line over capacitor array of memory cells of claim 2 wherein the electrically conductive material is conductively doped polysilicon.

4. The method of forming a bit line over capacitor array of memory cells of claim 1 wherein all of the electrically conductive material within the first contact openings is of the same composition as all of the electrically conductive material within the second contact openings during the single chemical-mechanical polishing step, the electrically conductive material being everywhere homogeneous within the first and second contact openings during the single chemical-mechanical polishing step.

5. The method of forming a bit line over capacitor array of memory cells of claim 4 wherein the electrically conductive material is conductively doped polysilicon.

6. The method of forming a bit line over capacitor array of memory cells of claim 1 wherein overall composition of the electrically conductive material within the first contact openings is different from overall composition of the electrically conductive material within the second contact openings during the single chemical-mechanical polishing step.

7. The method of forming a bit line over capacitor array of memory cells of claim 1 wherein overall composition of the electrically conductive material within the first contact openings is different from overall composition of the electrically conductive material within the second contact openings during the single chemical-mechanical polishing step, the composition of material within the second contact openings being homogeneous within the second contact openings during the single chemical-mechanical polishing step, the composition of material within the first contact openings being non-homogeneous during the single chemical-mechanical polishing step.

8. The method of forming a bit line over capacitor array of memory cells of claim 1 further comprising removing electrically conductive material extending over and above the insulating material upper surface downwardly to below the upper surface of insulating material.

9. The method of forming a bit line over capacitor array of memory cells of claim 1 wherein the electrically conductive material within the second contact openings is homogeneous within the second contact openings during the single chemical-mechanical polishing step and extends outwardly over the insulating material upper surface;

the electrically conductive material within the first contact openings comprising a capacitor storage node layer within the array, the capacitor storage node layer less than completely filling the first contact openings, the capacitor storage node layer and electrically conductive material extending outwardly of the second contact openings overlapping one another over the insulating material upper surface; and the single chemical-mechanical polishing step being conducted to define isolated capacitor storage nodes within the first contact openings and to define conductive plugs extending upwardly from the second active regions.

10. The method of forming a bit line over capacitor array of memory cells of claim 1 wherein the electrically conductive material within the second contact openings is homogeneous within the second contact openings during the single chemical-mechanical polishing step and extends outwardly over the insulating material upper surface;

the electrically conductive material within the first contact openings comprising a capacitor storage node layer within the array, the capacitor storage node layer less than completely filling the first contact openings, the capacitor storage node layer outwardly overlying the electrically conductive material extending outwardly of the second contact openings; and the single chemical-mechanical polishing step being conducted to define isolated capacitor storage nodes within the first contact openings and to define conductive plugs extending upwardly from the second active regions.

11. The method of forming a bit line over capacitor array of memory cells of claim 1 wherein the steps of providing electrically conductive material and single step chemical-mechanical polishing comprise:

providing a first layer of conductive material which overfills the first and second contact openings;

photopatterning the first layer to define a respective mask openings over the first active regions;

etching the first layer of conductive material through the mask openings selectively relative to the insulating material layer;

etching the insulating material layer through the mask openings to define a respective third contact openings which overlap with the first contact openings;

depositing an electrically conductive capacitor storage node layer over the first layer of conductive material and to within the third contact openings, the electrically conductive capacitor storage node layer electrically connecting with the first active regions; and single step chemical-mechanical polishing the capacitor storage node layer and first layer downwardly to at least the insulating layer outer surface to define isolated capacitor storage nodes within the first contact openings and to define conductive plugs extending upwardly from the second active regions.

12. The method of forming a bit line over capacitor array of memory cells of claim 1 further comprising, after the single step chemical-mechanical polishing, depositing a layer of masking material over the electrically conductive material within the first contact openings;

then, depositing a layer of hemispherical grain polysilicon over the masking material;

partial blanket etching through the hemispherical grain polysilicon over the electrically conductive material within the first contact openings selectively relative to the masking material to define a hemispherical grain polysilicon archipelago mask;

etching the masking material selectively relative to the polysilicon archipelago mask to form an archipelago mask of the masking material;

etching into the electrically conductive material within the first contact openings selectively relative to the masking material archipelago mask to form substantially vertical villus bars of electrically conductive material within the first contact openings; and providing a capacitor dielectric and a capacitor cell layer over the villus bars to define memory cell capacitors.

13. The method of forming a bit line over capacitor array of memory cells of claim 12 wherein the masking material comprises silicon dioxide.

14. The method of forming a bit line over capacitor array of memory cells of claim 1 further comprising:

removing electrically conductive material extending over and above the insulating material upper surface downwardly within the first contact openings to below the upper surface of insulating material to recess the electrically conductive material within the first contact openings, the respective recesses defining an edge of insulating material within the respective first contact openings; and after the single step chemical-mechanical polishing, depositing a layer of masking material over the recessed electrically conductive material within the first contact openings;

then, depositing a layer of hemispherical grain polysilicon over the masking material;

partial blanket etching through the hemispherical grain polysilicon over the electrically conductive material within the first contact openings selectively relative to the masking material to define a hemispherical grain polysilicon archipelago mask;

etching the masking material selectively relative to the polysilicon archipelago mask to form an archipelago mask of the masking material, the archipelago mask comprising masking material positioned over the electrically conductive material within the first contact openings against the respective recess edges;

etching into the electrically conductive material within the first contact openings selectively relative to the masking material archipelago mask to form substantially vertical villus bars of electrically conductive material within the, first contact openings; and providing a capacitor dielectric and a capacitor cell layer over the villus bars to define memory cell capacitors.

15. The method of forming a bit line over capacitor array of memory cells of claim 14 wherein the masking material comprises silicon dioxide.

* * * * *